(12) United States Patent
Lanzillo et al.

(10) Patent No.: US 12,417,979 B2
(45) Date of Patent: Sep. 16, 2025

(54) PASS-THROUGH WIRING IN NOTCHED INTERCONNECT

(71) Applicant: INTERNATIONAL BUSINESS MACHINES CORPORATION, Armonk, NY (US)

(72) Inventors: Nicholas Anthony Lanzillo, Wynantskill, NY (US); Albert M. Chu, Nashua, NH (US); Ruilong Xie, Niskayuna, NY (US); Reinaldo Vega, Mahopac, NY (US); Lawrence A. Clevenger, Saratoga Springs, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 466 days.

(21) Appl. No.: 18/174,692

(22) Filed: Feb. 27, 2023

(65) Prior Publication Data
US 2024/0290713 A1   Aug. 29, 2024

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76892* (2013.01); *H01L 23/5226* (2013.01)

(58) Field of Classification Search
CPC ........... H01L 23/5283; H01L 21/76885; H01L 23/5226; H01L 23/53257; H01L 21/76897; H01L 23/53242
See application file for complete search history.

(56) References Cited

U.S. PATENT DOCUMENTS

| | | |
|---|---|---|
| 6,503,845 B1 | 1/2003 | Nallan |
| 7,354,853 B2 | 4/2008 | Eissa |
| 8,629,536 B2 | 1/2014 | Mina |
| 9,508,642 B2 | 11/2016 | Bouche |
| 9,805,972 B1 | 10/2017 | Zhang |
| 9,911,651 B1 | 3/2018 | Briggs |
| 9,922,876 B1 | 3/2018 | Lee |
| 10,020,254 B1 | 7/2018 | Bao |
| 10,026,687 B1 | 7/2018 | Lin |
| 10,515,894 B2 | 12/2019 | Briggs |

(Continued)

OTHER PUBLICATIONS

Zhao et al., "Surface chemistry of thermal dry etching of cobalt thin films using hexafluoroacetylacetone (hfacH)", ScienceDirect, Applied Surface Science, vol. 455, Oct. 15, 2018, 4 pages.

*Primary Examiner* — Karen Kusumakar
(74) *Attorney, Agent, or Firm* — Yuanmin Cai

(57) ABSTRACT

Embodiments of present invention provide a semiconductor structure. The semiconductor structure includes a metal level, the metal level includes a metal strip including a notch at a side of the metal strip or a pass-through inside the metal strip, wherein the notch or the pass-through is at least partially filled with a dielectric material. The metal level further includes a conductive wiring that vertically passes through the metal strip. The conductive wiring is at least partially inside the notch or inside the pass-through and is insulated from the metal strip by the dielectric material. Methods of manufacturing the semiconductor structure are also provided.

20 Claims, 6 Drawing Sheets

(56) References Cited

U.S. PATENT DOCUMENTS

| | | |
|---|---|---|
| 10,741,441 B2 | 8/2020 | Li |
| 11,163,932 B2 | 11/2021 | Shao |
| 11,201,112 B2 | 12/2021 | Cheng |
| 2006/0180930 A1 | 8/2006 | Nguyen |
| 2015/0140812 A1 | 5/2015 | Zope |
| 2021/0375722 A1* | 12/2021 | Kim .................... H10D 84/038 |
| 2022/0005762 A1 | 1/2022 | Mignot |
| 2022/0139863 A1 | 5/2022 | Song |
| 2023/0245924 A1* | 8/2023 | Narkeviciute .......... H01L 21/32 257/760 |

* cited by examiner

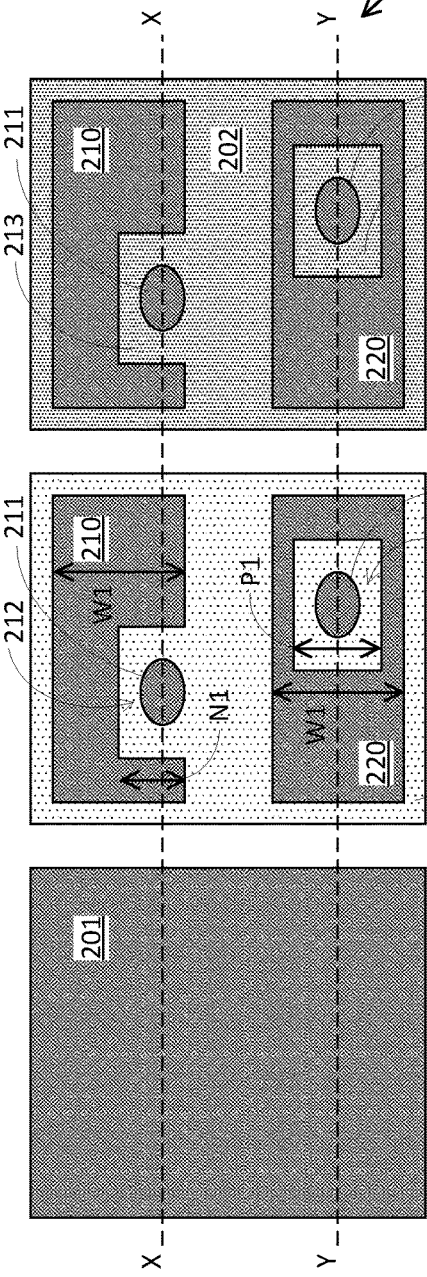

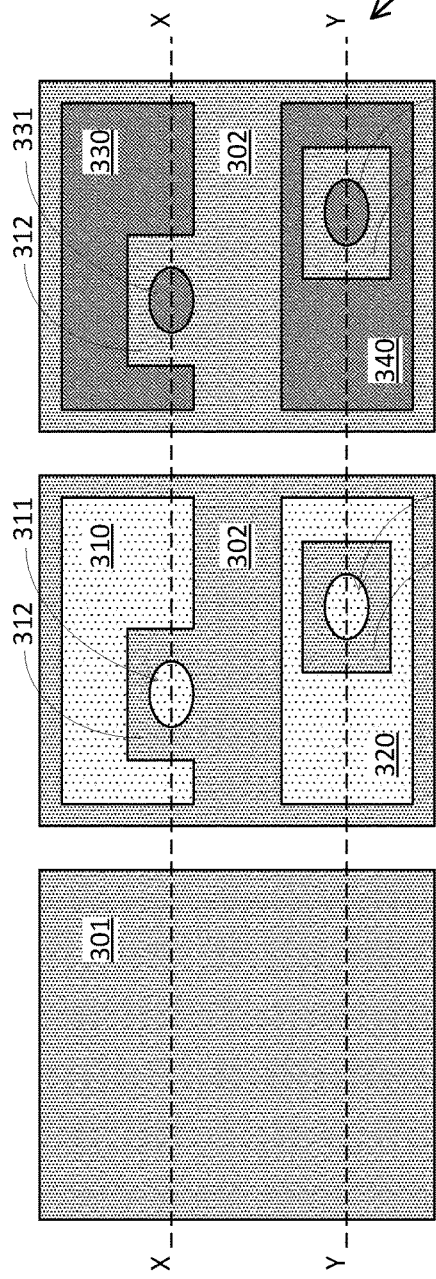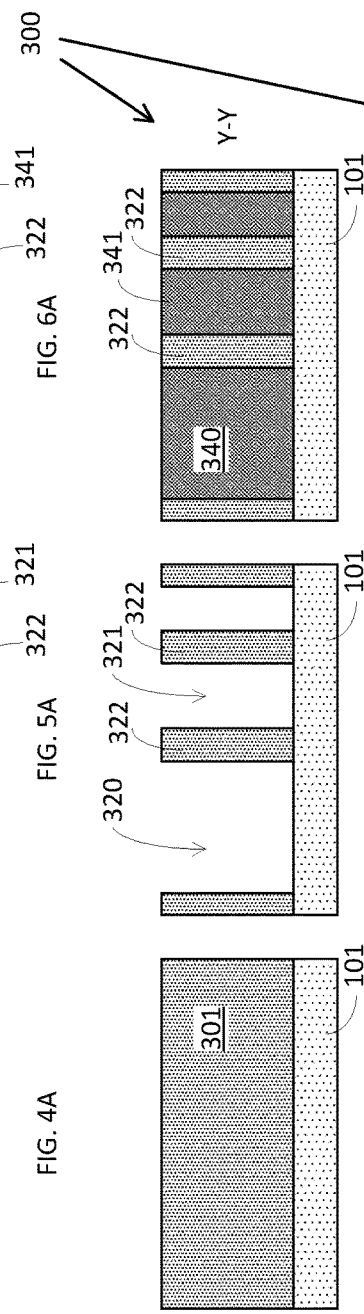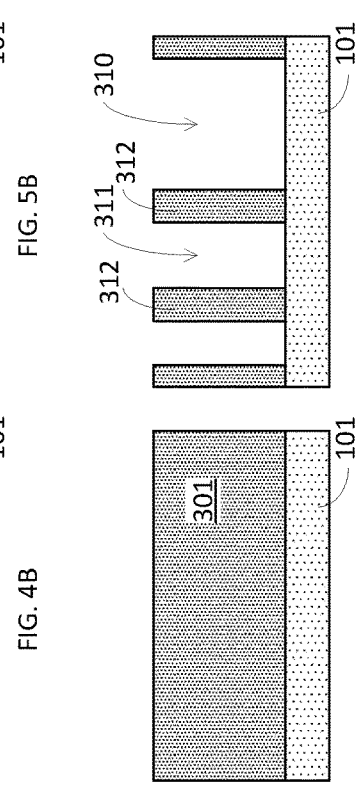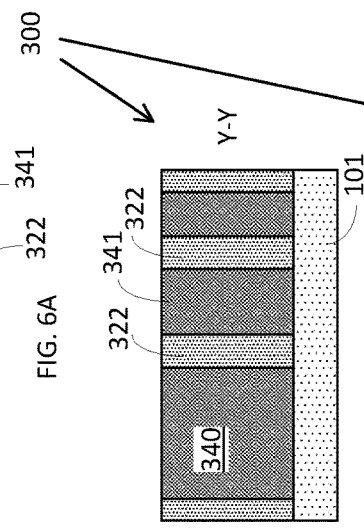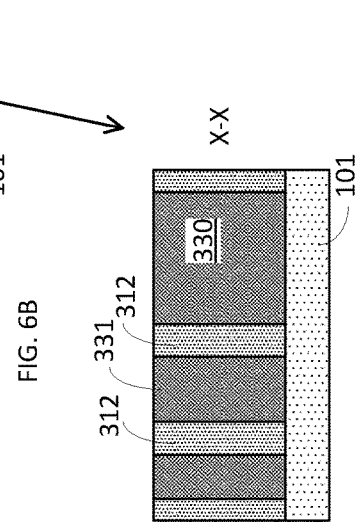

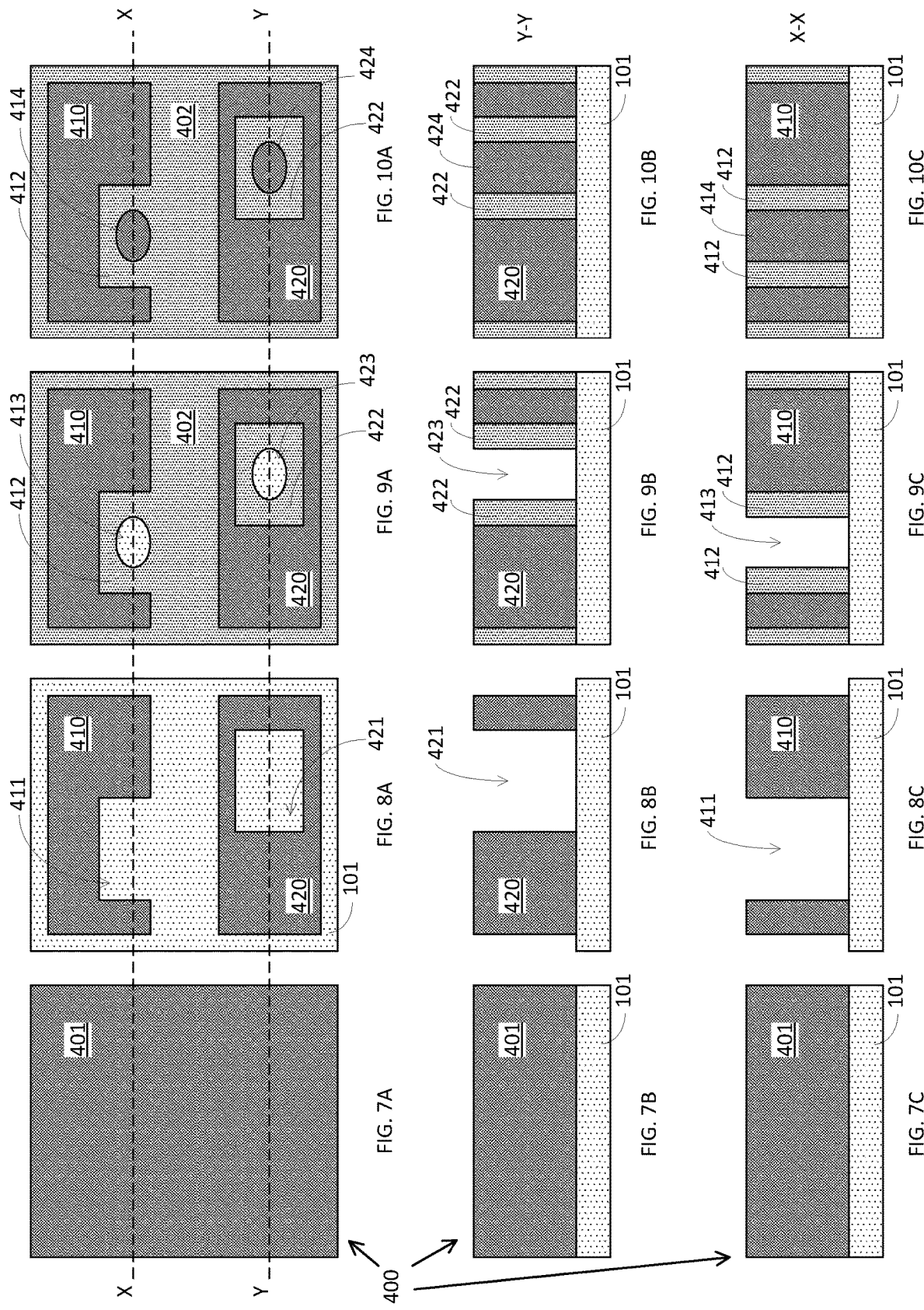

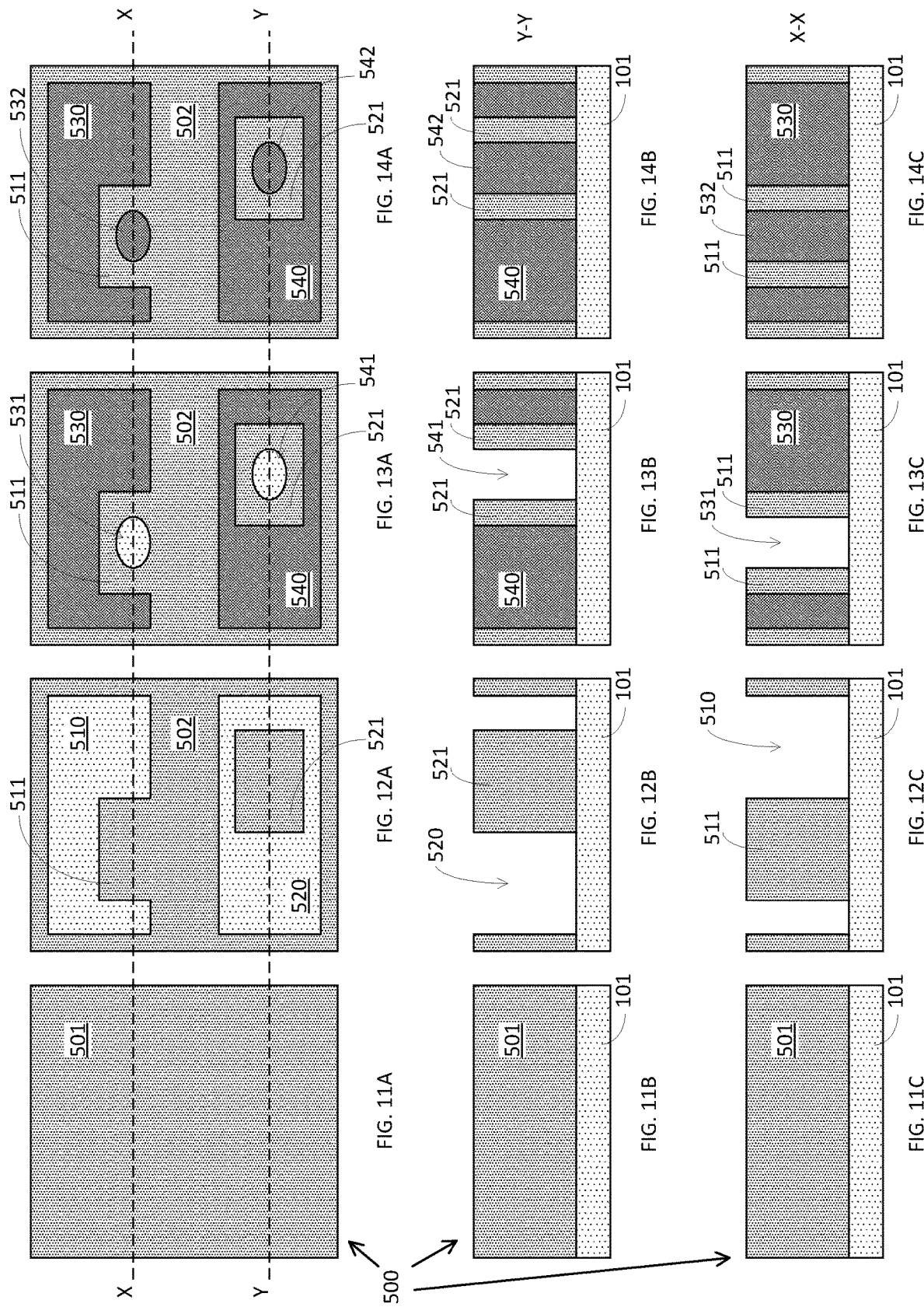

PASS-THROUGH WIRING IN NOTCHED INTERCONNECT

BACKGROUND

The present application relates to manufacturing of semiconductor integrated circuits. More particularly, it relates to pass-through wiring in notched interconnect and method of manufacturing thereof.

Advanced semiconductor chips contain millions or even billions of transistors that are interconnected and electrically powered to achieve certain device functionality. Current chip technology generally employs various metal lines or wirings made at the frontside of the chip, such as various metal levels with each metal level including various metal lines or wirings in a back-end-of-line (BEOL) setting, and the metal lines or wirings are made for signal routing and/or power distribution. As new technology platform emerges, there is a developing trend of moving at least some power delivery and/or distribution network to the backside of the chip, leaving the precious real estate of frontside of the chip for signal routing.

In a backside power distribution network (BSPDN), as the name implies, the wirings are mainly designed for power delivery and/or distribution, and generally there is not enough room left for making additional wirings for signal routing purpose. This poses a serious challenge when, in certain situations, some signal routing wirings need to be moved from the frontside of the chip to the backside of the chip.

SUMMARY

Embodiments of present invention provide a semiconductor structure. The semiconductor structure includes a metal level, the metal level includes a metal strip, including a notch at a side of the metal strip, and a conductive wiring, and the conductive wiring is at least partially inside the notch; vertically passes through the metal strip; and is insulated from the metal strip by a dielectric material.

In one embodiment, the semiconductor structure further includes a substrate and one or more transistor structures on a frontside of the substrate, where the metal level is at a backside of the substrate.

In another embodiment, the metal level is a first metal level; the metal strip is a first metal strip; and the notch is a first notch, the semiconductor structure further includes a second metal level above the first metal level, the second metal level including a second metal strip including a second notch at a side of the second metal strip, where the conductive wire is at least partially inside the second notch and insulated from the second metal strip.

In yet another embodiment, the metal level is a first metal level; and the metal strip is a first metal strip, the semiconductor structure further includes a second metal level above the first metal level, the second metal level including a second metal strip including a pass-through inside the second metal strip, where the conductive wire is inside the pass-through and insulated from the second metal strip.

In one embodiment, the second metal strip of the second metal level is oriented to be orthogonal to the first metal strip of the first metal level, and the conductive wiring is a conductive via.

In one embodiment, the notch formed at the side of the metal strip has a depth into the metal strip, wherein the depth is 50 percent or less of a width of the metal strip. In another embodiment, the metal strip has a width ranging from about 10 nm to about 100 nm.

Embodiments of present invention further provide a semiconductor structure. The semiconductor structure includes a metal level, the metal level including a metal strip including a pass-through inside the metal strip, where the pass-through is at least partially filled with a dielectric material.

In one embodiment, the metal level further includes a conductive wiring, the conductive wiring vertically passing through the pass-through and being insulated from the metal strip by the dielectric material.

In one embodiment, the metal level is a first metal level; the metal strip is a first metal strip; and the pass-through is a first pass-through, the semiconductor structure further includes a second metal level above the first metal level, the second metal level including a second metal strip including a second pass-through inside the second metal strip, where the conductive wiring is inside the second pass-through and insulated from the second metal strip.

Embodiments of present invention provide a method. The method includes providing a substrate with a frontside and a backside and at least one transistor structure on the frontside of the substrate; forming a metal level at the backside of the substrate, forming the metal level including forming a metal strip including a notch at a side of the metal strip or including a pass-through inside the metal strip, where the notch or the pass-through is at least partially filled with a dielectric material.

In one embodiment, forming the metal level further includes forming a conductive wiring that vertically passes through the metal strip, where the conductive wiring is at least partially inside the notch or inside the pass-through and being insulated from the metal strip by the dielectric material. According to one embodiment, forming the metal strip includes etching a layer of conductive material exposed by a hard-mask pattern to form the conductive wiring and the metal strip with the notch or the pass-through. According to another embodiment, forming the metal strip includes etching a layer of dielectric material exposed by a hard-mask pattern to create one or more openings in the layer of dielectric material and filling the one or more openings with a conductive material to form the conductive wiring and the metal strip with the notch or the pass-through.

In another embodiment, the method further includes creating an opening in the dielectric material in the notch or in the pass-through; and filling the opening with a conductive material to form a conductive wiring, the conductive wiring vertically passing through the metal strip and being insulated from the metal strip by the dielectric material.

BRIEF DESCRIPTION OF THE DRAWINGS

The present invention will be understood and appreciated more fully from the following detailed description of embodiments of present invention, taken in conjunction with accompanying drawings of which:

FIGS. 1A-1C to 3A-3C are demonstrative illustrations of top views and cross-sectional views of a semiconductor structure in a process of manufacturing thereof according to one embodiment of a method of present invention;

FIGS. 4A-4C to 6A-6C are demonstrative illustrations of top views and cross-sectional views of a semiconductor structure in a process of manufacturing thereof according to another embodiment of a method of present invention;

FIGS. 7A-7C to 10A-10C are demonstrative illustrations of top views and cross-sectional views of a semiconductor structure in a process of manufacturing thereof according to yet another embodiment of a method of present invention;

FIGS. 11A-11C to 14A-14C are demonstrative illustrations of top views and cross-sectional views of a semiconductor structure in a process of manufacturing thereof according to a further embodiment of a method of present invention;

Figure 15:
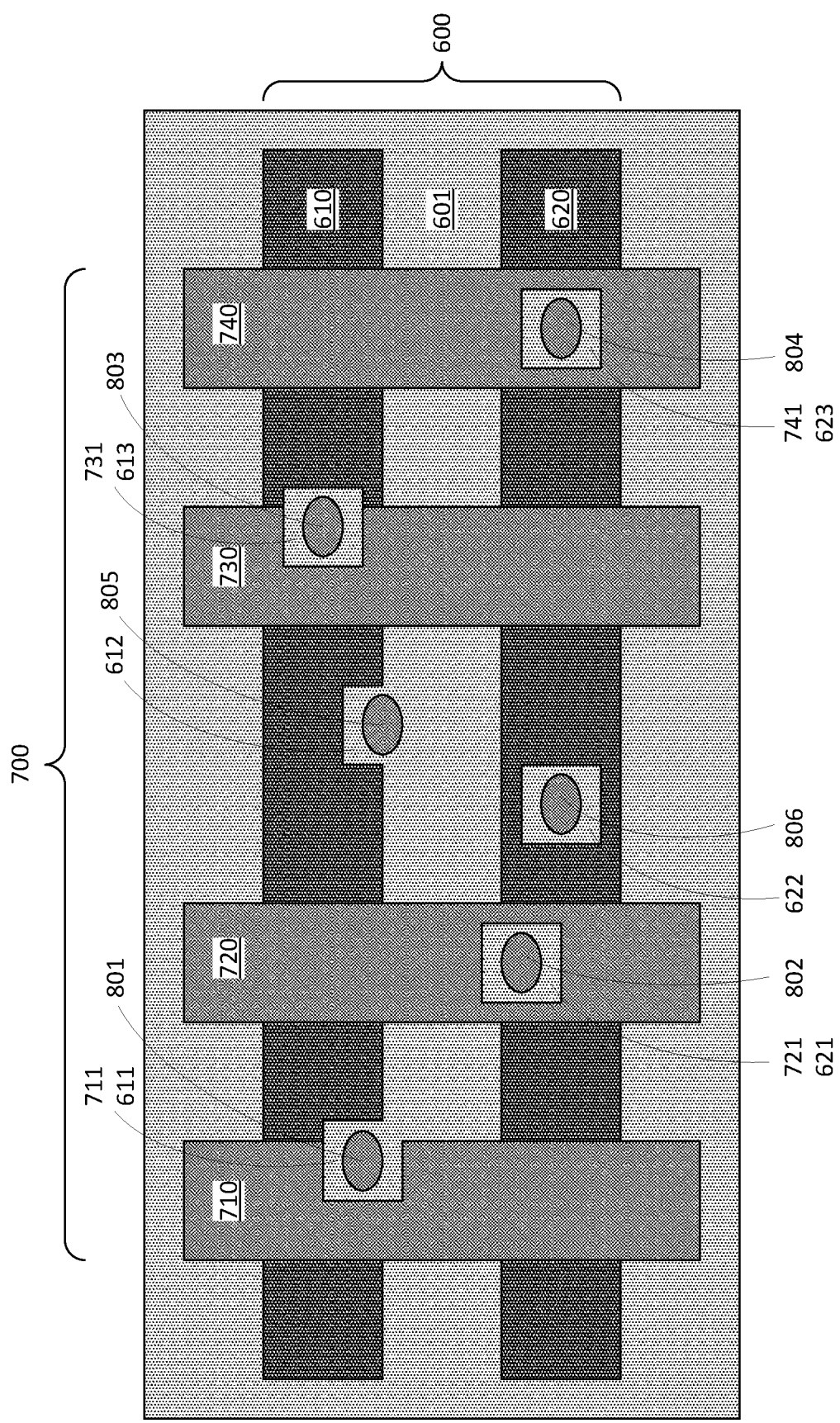
FIG. 15 is a demonstrative illustration of top view of a semiconductor structure according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A, 1B, and 1C to FIGS. 3A, 3B, and 3C are demonstrative illustrations of top views and cross-sectional views of a semiconductor structure in a process of manufacturing thereof according to one embodiment of a method of present invention. More particularly, figures numbered with a suffix "A" are top views of the semiconductor structure, figures numbered with a suffix "B" are cross-sectional views of the semiconductor structure at a location indicated by a dashed line Y-Y, and figures numbered with a suffix "C" are cross-sectional views of the semiconductor structure at a location indicated by a dashed line X-X. It is to be noted here that similar suffixes "A", "B", and "C" may be applied to FIGS. 4-14, as being described below in more details.

For example, embodiments of present invention provide receiving or providing a semiconductor substrate having a frontside and a backside. The frontside of the semiconductor substrate may include one or more transistor structures in a front-end-of-line (FEOL) structure. In one embodiment, a back-end-of-line (BEOL) structure with one or more metal levels may be formed at the frontside of the semiconductor substrate on top of the FEOL structure. In another embodiment, a backside power distribution network (BSPDN) structure with one or more metal levels may be formed at the backside of the semiconductor substrate. Hereinafter, embodiments of present invention may be described mainly in the context of forming the one or more metal levels at the backside of the semiconductor structure. However, a person skilled in the art will appreciate that same or similar description may be applied in forming the one or more metal levels at the frontside of the semiconductor substrate.

In forming the one or more metal levels, embodiments of present invention provide forming a metal level 200 through a subtractive patterning process. As is demonstratively illustrated in FIGS. 1A, 1B, and 1C, a conductive material layer such as a metal layer 201 may be formed on top of a supporting structure 101 through, for example, a chemical vapor deposition (CVD) process, an atomic layer deposition (ALD) process, or a physical vapor deposition (PVD) process. The supporting structure 101 may be a part of the BSPDN structure, a part of the BEOL structure, a middle-of-line (MOL) structure, a FEOL structure, or a substrate such as a semiconductor substrate. For example, as one embodiment, the metal layer 201 may be formed at a backside of the supporting structure 101 which may be a substrate. The metal layer 201 may include conductive materials such as, for example, copper (Cu), aluminum (Al), cobalt (Co), ruthenium (Ru), tungsten (W), molybdenum (Mo), and other materials suitable for forming the metal level 200.

Embodiments of present invention provide patterning the metal layer 201 to form multiple metal lines such as, for example, a first metal line and/or a second metal line of the metal level 200. The first and/or second metal lines may form at least part of an interconnect. More specifically, the first metal line may include a first metal strip 210 and may include, for example, a notch 212 at a side of the first metal strip 210. The second metal line may include a second metal strip 220 and may include, for example, a pass-through 222 inside the second metal strip 220. The first and second metal strips 210 and 220, as being illustrated in FIGS. 2A, 2B, and 2C, run horizontally to have a length along the horizontal direction. Embodiments of present invention further provide patterning the metal layer 201 to form a conductive wiring 211 that is at least partially inside the notch 212 but separated from the first metal strip 210, and/or a conductive wiring 221 that is inside the pass-through 222 but separated from the second metal strip 220.

In one embodiment, the first metal strip 210 and/or the second metal strip 220 may have a width W1 ranging from about 10 nm to about 100 nm, and the width W1 is defined as a width measured vertically, as illustrated in FIG. 2A, at a region without the notch 212 or the pass-through 222. In the backside of the semiconductor substrate, since the first metal strip 210 and/or the second metal strip 220 are mainly used as metal lines for backside power distribution, such as for example as a part of the BSPDN structure, their widths are generally larger or bigger than metal lines of metal levels in the BEOL structure at the frontside of the semiconductor substrate.

In one embodiment, the notch 212 formed at one side of the first metal strip 210 may have a depth N1 into the first metal strip 210, and the depth N1 may be about 50 percent or less of the width W1 of the first metal strip 210. In another embodiment, the pass-through 222 in the second metal strip 220 may be significantly a rectangular shape, and the rectangular shape may have a width P1, along the width W1 of the second metal strip 220, that is about 50 percent or less of the width W1 of the second metal strip 220.

In one embodiment, the conductive wirings 211 and 221 may be conductive vias that run in a direction vertical to the first and second metal strips 210 and 220 such as in a direction into/out of the paper, as is illustrated in FIG. 2A, or in an up/down direction parallel to the paper, as are illustrated in FIGS. 2B and 2C. In other words, conductive wirings 211 and 221 vertically pass through the first and second metal strips 210 and 220 and, as being described below in more details, are insulated from the first and second metal strips 210 and 220 respectively by dielectric materials.

The first and second metal strips 210 and 220 and the conductive wirings 211 and 221 may be patterned through a lithographic patterning and etching process. More specifically, a hard mask may be formed to cover a portion of the metal layer 201. The hard mask may have a mask pattern representing the first and second metal strips 210 and 220 and the conductive wirings 211 and 221. Next, a selective etching process, such as a reactive-ion-etching (RIE) process, may be applied to remove or etch away portions of the metal layer 201 that are not covered by the hard mask to expose the underneath supporting structure 101, thereby resulting remaining portions of the metal layer 201 to become the first and second metal strips 210 and 220 and the conductive wirings 211 and 221.

Furthermore, embodiments of present invention provide forming a dielectric layer 202, such as through a CVD, ALD, or PVD process, surrounding the first and second metal strips 210 and 220 and the conductive wirings 211 and 221. As being demonstratively illustrated in FIGS. 3A, 3B, and 3C, the notch 212 becomes a notch 213 filled with material of the dielectric layer 202, and the conductive wiring 211 is surrounded by the material of the dielectric layer 202 to be insulated from the first metal strip 210. Similarly, the pass-through 222 becomes a pass-through 223 filled with material of the dielectric layer 202, and the conductive wiring 221 is surrounded by the material of the dielectric layer 202 to be insulated from the second metal strip 220.

FIGS. 4A, 4B, and 4C to FIGS. 6A, 6B, and 6C are demonstrative illustrations of top views and cross-sectional views of a semiconductor structure in a process of manufacturing thereof according to one embodiment of a method of present invention. More particularly, embodiments of present invention provide forming a metal level 300 through a damascene patterning process. As is demonstratively illustrated in FIGS. 4A, 4B, and 4C, a dielectric material layer such as a dielectric layer 301 may be formed on top of the supporting structure 101 through a CVD, ALD, or PVD process. The dielectric layer 301 may be silicon-nitride (SiN), silicon-carbonitride (SiCN), silicon-carbide (SIC), aluminum-oxide ($AlO_2$), aluminum-nitride (AlN), and other suitable materials.

Embodiments of present invention provide forming one or more openings in the dielectric layer 301, through a lithographic patterning and etching process. The one or more openings may include, for example, a first opening 310 for a first metal line and a second opening 320 for a second metal line that may run horizontally, as illustrated in FIGS. 5A, 5B, and 5C. In one embodiment, additional openings such as a third opening 311 and a fourth opening 321 may be formed in the dielectric layer 301 for a first conductive wiring 331 and a second conductive wiring 341 respectively. The formation of the first, second, third, and fourth openings 310, 320, 311, and 321 transforms the dielectric layer 301 into a dielectric layer 302, which surrounds the first, second, third, and fourth openings 310, 320, 311, and 321. The first, second, third, and fourth openings 310, 320, 311, and 321 may be made by first forming a hard mask covering portions of the dielectric layer 301 and removing, through a selective etching process, portions of the dielectric layer 301 that are not covered by the hard mask to form the openings.

The first opening 310 for the first metal line may include a notch 312 made of the material of the dielectric layer 302 that in-turn surrounds the third opening 311 for the first conductive wiring 331. The second opening 320 for the second metal line may include a pass-through 322 made of the material of the dielectric layer 302 that in-turn surrounds the fourth opening 321 for the second conductive wiring 341.

Embodiments of present invention provide further filling the first, second, third, and fourth openings 310, 320, 311, and 321 with a conductive material such as Cu, Co, Al, Ru, W, Mo, etc. to form the first metal line and the second metal line and the first and second conductive wirings. More particularly, as illustrated in FIGS. 6A, 6B, and 6C, the first metal line may include a first metal strip 330 and the first conductive wiring 331 may be at least partially inside the notch 312 and surrounded by the dielectric layer 302. The second metal line may include a second metal strip 340 and the second conductive wiring 341 may be inside the pass-through 322 and surrounded by the dielectric layer 302.

The first metal strip 330 and the second metal strip 340 may have a width W1, the notch 312 may have a depth N1, and the pass-through 322 may have a width P1 that are similar to those as being discussed above with reference to FIG. 2A. Moreover, the first and second conductive wirings 331 and 341 may be conductive vias, similar to conductive wirings 211 and 221.

FIGS. 7A, 7B, and 7C to FIGS. 10A, 10B, and 10C are demonstrative illustrations of top views and cross-sectional views of a semiconductor structure in a process of manufacturing thereof according to one embodiment of a method of present invention. More particularly, embodiments of present invention provide forming a metal level 400 through a combination of subtractive patterning process and a damascene patterning process. For example, a first and a second metal line may first be formed through a subtractive patterning process. A notch and/or a pass-through may be formed, optionally together with the formation of the first and second metal lines. Next, a conductive wiring or via that is at least partially inside the notch and/or a conductive wiring or via that is fully inside the pass-through may be formed through a damascene patterning process.

More specifically, as illustrated in FIGS. 7A, 7B, and 7C, embodiments of present invention provide forming a conductive material layer such as a metal layer 401 on top of the supporting structure 101 through a CVD, ALD, or PVD process. The metal layer 401 may include conductive materials such as, for example, Cu, Al, Co, Ru, W, Mo, and other materials suitable for forming the metal level 400.

Embodiments of present invention provide patterning the metal layer 401 to form multiple metal lines such as, for example, a first metal line and a second metal line of the metal level 400. For example, as being illustrated in FIGS. 8A, 8B, and 8C, the first metal line may include a first metal strip 410 and the second metal line may include a second metal strip 420. In one embodiment, the first metal line may be formed to include a notch 411 at a side of the first metal strip 410. In another embodiment, the second metal line may be formed to include a pass-through 421 inside the second metal strip 420.

However, embodiments of present invention are not limited in this aspect. For example, in one embodiment, the notch 411 and/or the pass-through 421 may be formed in a separate subtractive patterning process or a damascene patterning process after the first metal strip 410 and/or the second metal strip 420 is formed.

As being demonstratively illustrated in FIGS. 9A, 9B, and 9C, a dielectric layer 402 may be formed, through a CVD, ALD, or PVD process, to surround the first metal strip 410 and the second metal strip 420. The dielectric layer 402 may fill the opening of the notch 411 and the opening of the pass-through 421, thus producing a notch 412 and a pass-through 422, and to surround the first and second metal strips 410 and 420. As being described above, in one embodiment, the notch 411 and/or the pass-through 421 may be created at this stage through a subtractive patterning process before the dielectric layer 402 is formed to surround the first and second metal strips 410 and 420, and after the creation of the notch 411 and/or the pass-through 421 the dielectric layer 402 may be formed to fill the opening of the notch 411 and the opening of the pass-through 421 to produce a notch 412 and a pass-through 422. The dielectric layer 402 may be SiN, SiCN, SiC, AlO$_2$, AlN, and other suitable materials.

Embodiments of present invention provide further forming a first and a second conductive wirings at least partially in the notch 412 and/or inside the pass-through 422 through a damascene patterning process. More specifically, a first opening 413 may be created in the dielectric layer 402 in the notch 412 and a second opening 423 may be created in the dielectric layer 402 inside the pass-through 422. The first and second openings 413 and 423 may be created through a lithographic patterning and etching process.

As being demonstratively illustrated in FIGS. 10A, 10B, and 10C, following the creation of the first and second openings 413 and 423, embodiments of present invention provide filling the first and second openings 413 and 423 with a conductive material to form a first conductive wiring 414 and a second conductive wiring 424. The first and second conductive wirings 414 and 424, which may be conductive vias, are surrounded by the material of the dielectric layer 402 and thus insulated from the first metal strip 410 and the second metal strip 420 respectively. The first and second metal strips 410 and 420, the notch 412, and the pass-through 422 may have their respective widths and/or depth as those being described above with reference to FIG. 2A.

FIGS. 11A, 11B, and 11C to FIGS. 14A, 14B, and 14C are demonstrative illustrations of top views and cross-sectional views of a semiconductor structure in a process of manufacturing thereof according to one embodiment of a method of present invention. More particularly, embodiments of present invention provide forming a metal level 500 through a combination of subtractive patterning process and a damascene patterning process. For example, a first and a second metal line may first be formed through a damascene patterning process. A notch and/or a pass-through may be formed next, or optionally formed together with the formation of the first and second metal lines. Next, a conductive wiring or via that is at least partially inside the notch and/or a conductive wiring that is fully inside the pass-through may be formed through a damascene patterning process.

More specifically, as illustrated in FIGS. 11A, 11B, and 11C, embodiments of present invention provide forming a dielectric material layer such as a dielectric layer 501 on top of the supporting structure 101 through a CVD, ALD, or PVD process. The dielectric layer 501 may be SiN, SiCN, SiC, AlO$_2$, AlN, and other suitable materials.

Embodiments of present invention provide forming one or more openings in the dielectric layer 501, through a lithographic patterning and etching process. The one or more openings may include, for example, a first opening 510 for a first metal line and a second opening 520 for a second metal line, as illustrated in FIGS. 12A, 12B, and 12C, that may run horizontally. The formation of the first and second openings 510 and 520 transforms the dielectric layer 501 into a dielectric layer 502, which surrounds the first and second openings 510 and 520. The openings may be made by first forming a hard mask covering portions of the dielectric layer 501 and removing, through a selective etching process, portions of the dielectric layer 501 that are not covered by the hard mask to form the openings.

The first opening 510 for the first metal line may include a notch 511 made of the material of the dielectric layer 502 and the second opening 520 for the second metal line may include a pass-through 521 made of the material of the dielectric layer 502. However, embodiments of present invention are not limited in this aspect. For example, in one embodiment, the notch 511 and/or the pass-through 521 may be formed in a separate subtractive patterning process or a damascene patterning process.

As being demonstratively illustrated in FIGS. 13A, 13B, and 13C, embodiments of present invention provide further filling the first and second openings 510 and 520 with a conductive material such as Cu, Co, Al, Ru, etc. to form a first metal line and a second metal line. More particularly, the first metal line may include a first metal strip 530 and the second metal line may include a second metal strip 540.

Embodiments of present invention provide further forming a first and a second conductive wirings at least partially in the notch 511 and/or inside the pass-through 521 through a damascene patterning process. More specifically, a first opening 531 may be created in the dielectric layer 502 in the notch 511 and a second opening 541 may be created in the dielectric layer 502 inside the pass-through 521. The first and second openings 531 and 541 may be created through a lithographic patterning and etching process.

As being demonstratively illustrated in FIGS. 14A, 14B, and 14C, following the creation of the first and second openings 531 and 541, embodiments of present invention provide filling the first and second openings 531 and 541 with a conductive material to form a first conductive wiring 532 and a second conductive wiring 542. The first and second conductive wirings 532 and 542 are surrounded by the material of the dielectric layer 502 and insulated from the first metal strip 530 and the second metal strip 540 respectively by the dielectric layer 502. The first and second metal strips 530 and 540, the notch 511, and the pass-through 521 may have their respective widths and/or depth as those being described above with reference to FIG. 2A.

FIG. 15 is a demonstrative illustration of top view of a semiconductor structure according to embodiments of present invention. More particularly, embodiments of present invention provide a semiconductor structure that includes multiple metal levels such as, for example, a first metal level 600, a second metal level 700, and one or more metal levels. Moreover, each metal levels may include one or more metal lines. For example, the metal level 600 may include a first metal line that includes a first metal strip 610 with one or more notches such as notches 611 and 612 and one or more pass-throughs such as a pass-through 613. The metal level 600 may also include a second metal line that includes a second metal strip 620 with one or more notches such as a notch 621 and one or more pass-throughs such as pass-throughs 622 and 623. Further for example, the second metal level 700 may include a first metal line that includes a first metal strip 710 with, for example, a notch 711; a second metal line that includes a second metal strip 720 with, for example, a pass-through 721; a third metal line that includes a third metal strip 730 with, for example, a notch 731; and a fourth metal line that includes a fourth metal strip 740 with, for example, a pass-through 741. The notches 611, 612, 621, 711, 731 and pass-throughs 613, 622, 623, 721, 741 may be filled with material of a dielectric layer 601. The second metal strips 710, 720, 730, and 740 of the second metal level 700 may be oriented to be orthogonal to the first metal strips 610 and 620 of the first metal level 600. Conductive wirings such as conductive wirings 801, 802, 803, 804, 805, and 806 may pass through the notches or pass-throughs while being surrounded by the dielectric materials of the dielectric layer 601 and insulated from the metal strips 610, 620, 710, 720, 730, and 740.

In one embodiment, the notch 611 of the first metal strip 610 may overlap with the notch 711 of the first metal strip 710 and the conductive wiring 801 is at least partially in the notches 611 and 711. In another embodiment, the notch 621 of the second metal strip 620 may overlap with the pass-through 721 of the second metal strip 720 and the conductive wiring 802 is inside the pass-through 721 and at least partially in the notch 621. In yet another embodiment, the pass-through 613 of the first metal strip 610 may overlap with the notch 731 of the third metal strip 730 and the conductive wiring 803 is inside the pass-through 613 and at least partially in the notch 731. In a further embodiment, the pass-through 623 of the second metal strip 620 may overlap with the pass-through 741 of the fourth metal strip 740 and the conductive wiring 804 is inside both the pass-through 623 and the pass-through 741.

In one embodiment, a notch such as the notch 612 of the first metal strip 610 and/or a pass-through such as the pass-through 622 of the second metal strip 620 may not overlap with metal lines or metal strips in another metal level such as the second metal level 700.

Figure 16:
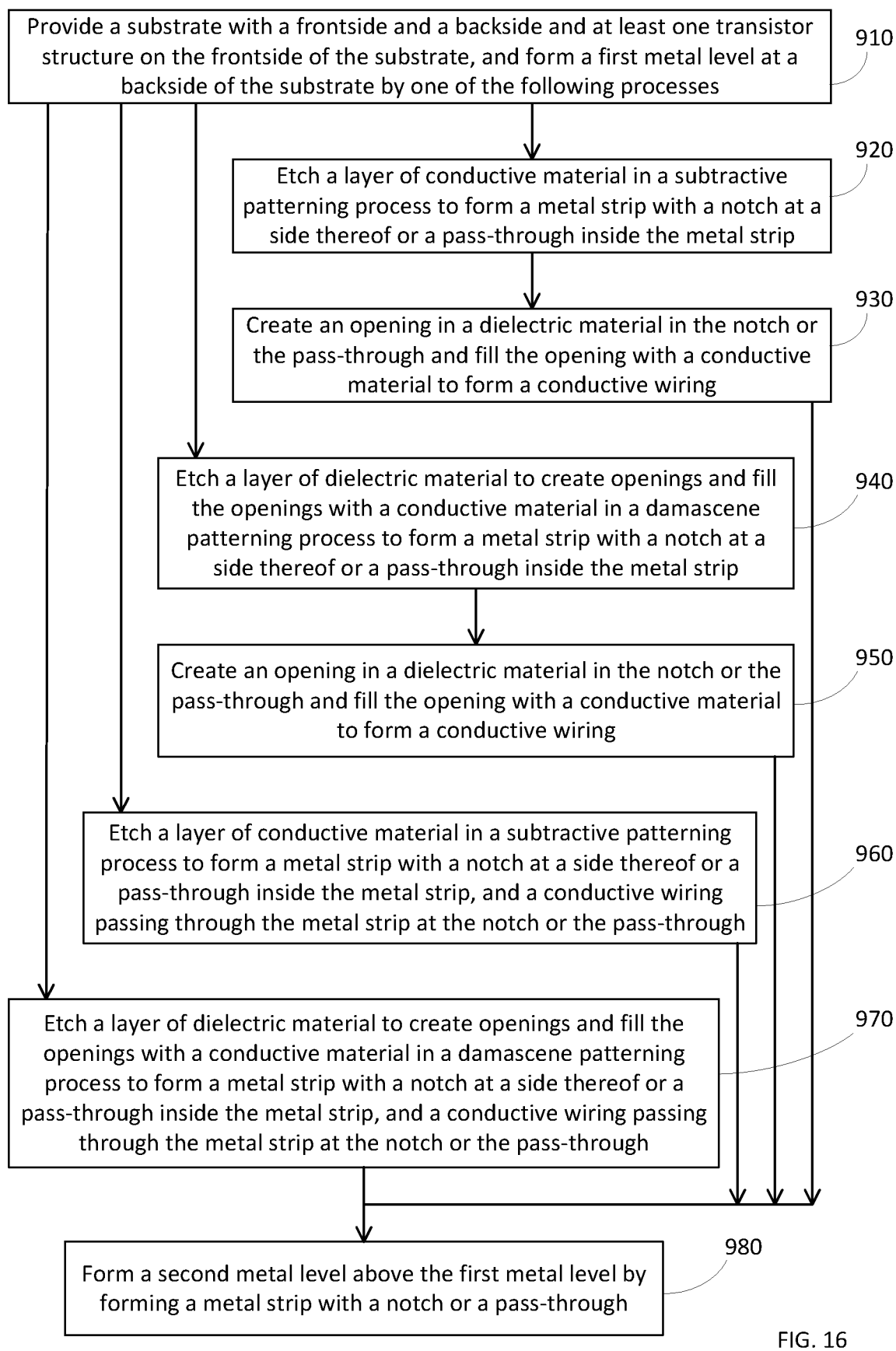
FIG. 16 is a demonstrative illustration of a flow-chart of a method of manufacturing a semiconductor structure according to embodiments of present invention.

FIG. 16 is a demonstrative illustration of a flow-chart of a method of manufacturing a semiconductor structure according to embodiments of present invention. The method includes (910) providing a substrate with a frontside and a backside and at least one transistor structure at the frontside of the substrate, and forming a first metal level at a backside of the substrate by one of the following processes: (920) etching a layer of conductive material in a subtractive patterning process to form a metal strip with a notch at a side of the metal strip or a pass-through inside the metal strip, and (930) creating an opening in a dielectric material in the notch or in the pass-through and filling the opening with a conductive material to form a conductive wiring or via, or (940) etching a layer of dielectric material to create openings and filling the openings with a conductive material in a damascene patterning process to form a metal strip with a notch at a side of the metal strip or a pass-through inside the metal strip, and (950) creating an opening in a dielectric material in the notch or in the pass-through and filling the opening with a conductive material to form a conductive wiring or via, or (960) etching a layer of conductive material in a subtractive patterning process to form a metal strip with a notch at a side of the metal strip or a pass-through inside the metal strip, and a conductive wiring vertically passing through the metal strip at the notch or the pass-through, or (970) etching a layer of dielectric material to create openings and fill the openings with a conductive material in a damascene patterning process to form a metal strip with a notch at a side of the metal strip or a pass-through inside the metal strip, and a conductive wiring vertically passing through the metal strip at the notch or the pass through, and (980) forming a second metal level above the first metal level by forming another metal strip with a notch or a pass-through.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising a metal level, the metal level comprising:
   a metal strip including a notch at a side of the metal strip; and
   a conductive wiring, the conductive wiring being at least partially inside the notch; vertically passing through the metal strip; and being insulated from the metal strip by a dielectric material.

2. The semiconductor structure of claim 1, further comprising a substrate having a frontside and a backside and one or more transistor structures on the frontside of the substrate, wherein the metal level is at the backside of the substrate.

3. The semiconductor structure of claim 2, wherein the metal level is a first metal level; the metal strip is a first metal strip; and the notch is a first notch, further comprising a second metal level above the first metal level, the second metal level comprising a second metal strip including a second notch at a side of the second metal strip, wherein the conductive wire is at least partially inside the second notch and insulated from the second metal strip.

4. The semiconductor structure of claim 2, wherein the metal level is a first metal level; and the metal strip is a first metal strip, further comprising a second metal level above the first metal level, the second metal level comprising a second metal strip including a pass-through inside the second metal strip, wherein the conductive wire is inside the pass-through and insulated from the second metal strip.

5. The semiconductor structure of claim 4, wherein the second metal strip of the second metal level is oriented to be orthogonal to the first metal strip of the first metal level, and the conductive wiring is a conductive via.

6. The semiconductor structure of claim 1, wherein the notch formed at the side of the metal strip has a depth into the metal strip, wherein the depth is 50 percent or less of a width of the metal strip.

7. The semiconductor structure of claim 1, wherein the metal strip has a width ranging from about 10 nm to about 100 nm.

8. A semiconductor structure comprising a metal level, the metal level comprising a metal strip including a pass-through inside the metal strip, wherein the pass-through is at least partially filled with a dielectric material.

9. The semiconductor structure of claim 8, wherein the metal level further includes a conductive wiring, the conductive wiring vertically passing through the pass-through and being insulated from the metal strip by the dielectric material.

10. The semiconductor structure of claim 9, wherein the metal level is a first metal level; the metal strip is a first metal strip; and the pass-through is a first pass-through, further comprising a second metal level above the first metal level, the second metal level comprising a second metal strip including a second pass-through inside the second metal strip, wherein the conductive wiring is inside the second pass-through and insulated from the second metal strip.

11. The semiconductor structure of claim 9, wherein the metal level is a first metal level; and the metal strip is a first metal strip, further comprising a second metal level above the first metal level, the second metal level comprising a second metal strip including a notch at a side of the second metal strip, wherein the conductive wiring is at least partially inside the notch and insulated from the second metal strip.

12. The semiconductor structure of claim 11, wherein the second metal strip of the second metal level is oriented to be orthogonal to the first metal strip of the first metal level, and the conductive wiring is a conductive via.

13. The semiconductor structure of claim 8, wherein the metal strip has a width ranging from about 10 nm to about 100 nm, and the pass-through inside the metal strip has a rectangular shape with a width of the rectangular shape no larger than 50 percent of the width of the metal strip.

14. A method comprising:
   providing a substrate with a frontside and a backside and at least one transistor structure on the frontside of the substrate;
   forming a metal level at the backside of the substrate, forming the metal level comprising forming a metal strip including a notch at a side of the metal strip or including a pass-through inside the metal strip, wherein the notch or the pass-through is at least partially filled with a dielectric material.

15. The method of claim 14, wherein forming the metal level further comprises forming a conductive wiring that vertically passes through the metal strip, wherein the conductive wiring is at least partially inside the notch or inside the pass-through and being insulated from the metal strip by the dielectric material.

16. The method of claim 15, wherein forming the metal strip comprises depositing a layer of conductive material on top of a substrate; forming a hard-mask pattern on top of the layer of conductive material; etching the layer of conductive material exposed by the hard-mask pattern to form the conductive wiring and the metal strip with the notch or the pass-through; and filling the notch or the pass-through with the dielectric material, the dielectric material thereby surrounding the conductive wiring.

17. The method of claim 15, wherein forming the metal strip comprises depositing a layer of dielectric material on top of a substrate; forming a hard-mask pattern on top of the layer of dielectric material; etching the layer of dielectric material exposed by the hard-mask pattern to create one or more openings in the layer of dielectric material; and filling the one or more openings with a conductive material to form the conductive wiring and form the metal strip with the notch or the pass-through.

18. The method of claim 14, further comprising creating an opening in the dielectric material in the notch or in the pass-through; and filling the opening with a conductive material to form a conductive wiring, the conductive wiring vertically passing through the metal strip and being insulated from the metal strip by the dielectric material.

19. The method of claim 18, wherein forming the metal strip comprises depositing a layer of conductive material on top of a substrate; forming a hard-mask pattern on top of the layer of conductive material; etching the layer of conductive material exposed by the hard-mask pattern to form the metal strip with the notch or with the pass-through; and filling the notch or the pass-through with the dielectric material.

20. The method of claim 18, wherein forming the metal strip comprises depositing a layer of dielectric material on top of a substrate; forming a hard-mask pattern on top of the layer of dielectric material; etching the layer of dielectric material exposed by the hard-mask pattern to create one or more openings in the layer of dielectric material; and filling the one or more openings with the conductive material to form the metal strip with the notch or with the pass-through.

* * * * *